(12) United States Patent
Cheng et al.

(10) Patent No.: US 11,239,141 B2
(45) Date of Patent: Feb. 1, 2022

(54) LEAD FRAME PACKAGE

(71) Applicant: INDUSTRIAL TECHNOLOGY RESEARCH INSTITUTE, Hsinchu (TW)

(72) Inventors: Ren-Shin Cheng, Tainan (TW); Shih-Hsien Wu, Taoyuan (TW); Yu-Wei Huang, Chiayi (TW); Chih Ming Shen, New Taipei (TW); Yi-Chieh Tsai, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 17/031,486

(22) Filed: Sep. 24, 2020

(65) Prior Publication Data

US 2022/0005754 A1    Jan. 6, 2022

(30) Foreign Application Priority Data

Jul. 3, 2020  (TW) .................................. 109122628

(51) Int. Cl.
  *H01L 23/495*   (2006.01)
  *H01L 23/48*    (2006.01)
  (Continued)

(52) U.S. Cl.
  CPC ........ *H01L 23/49537* (2013.01); *H01L 21/56* (2013.01); *H01L 23/28* (2013.01);
  (Continued)

(58) Field of Classification Search
  CPC ......... H01L 23/49537; H01L 23/49575; H01L 23/49811; H01L 23/49531; H01L 23/3107;
  (Continued)

(56) References Cited

U.S. PATENT DOCUMENTS

| 6,078,097 A | 6/2000 | Ohsawa |
| 7,569,920 B2 * | 8/2009 | Otremba ............... H01L 25/074 257/686 |
| 9,048,338 B2 * | 6/2015 | Hosseini .......... H01L 23/49575 |
| 9,613,829 B1 | 4/2017 | Lee |
| 10,546,840 B2 * | 1/2020 | Terrill ................. H01L 21/4853 |

(Continued)

FOREIGN PATENT DOCUMENTS

| CN | 107112285 A | 8/2017 |
| CN | 208608186 | 3/2019 |

(Continued)

OTHER PUBLICATIONS

TW Office Action in Application No. 109122628 dated Dec. 31, 2020.

(Continued)

*Primary Examiner* — Alonzo Chambliss
(74) *Attorney, Agent, or Firm* — Maschoff Brennan

(57) ABSTRACT

A lead frame package including first conductive layer, first electronic component, lead frames, second conductive layer and package body. First conductive layer has conductive carriers. First electronic component has first pins. Lead frames and first pins are respectively electrically connected to conductive carriers. Second conductive layer has conductive joints respectively electrically connected to lead frames so as to be electrically connected to at least a part of conductive carriers via lead frames. Package body encapsulates first conductive layer, first electronic component, and lead frames. First conductive layer and second conductive layer are located on two opposite sides of first electronic component, respectively.

21 Claims, 11 Drawing Sheets

(51) Int. Cl.
| | |
|---|---|
| *H01L 23/28* | (2006.01) |
| *H01L 21/00* | (2006.01) |
| *H01L 21/44* | (2006.01) |
| *H05K 5/02* | (2006.01) |
| *H01L 23/498* | (2006.01) |
| *H01L 21/56* | (2006.01) |
| *H01L 23/31* | (2006.01) |

(52) U.S. Cl.
CPC .. *H01L 23/49531* (2013.01); *H01L 23/49541* (2013.01); *H01L 23/49548* (2013.01); *H01L 23/49575* (2013.01); *H01L 23/49582* (2013.01); *H01L 23/49811* (2013.01); *H01L 23/3107* (2013.01); *H01L 23/4952* (2013.01); *H01L 23/49551* (2013.01); *H01L 23/49579* (2013.01)

(58) Field of Classification Search
CPC ......... H01L 23/49541; H01L 23/49548; H01L 23/4952; H01L 23/49582; H01L 21/56; H01L 23/28
See application file for complete search history.

(56) References Cited

U.S. PATENT DOCUMENTS

2008/0087913 A1* 4/2008 Otremba ................ H01L 24/40
257/177
2012/0326287 A1* 12/2012 Joshi ................ H01L 23/49562
257/676

FOREIGN PATENT DOCUMENTS

| TW | 200721442 | 6/2007 |
|---|---|---|
| TW | M540449 | 4/2017 |
| TW | I618160 | 3/2018 |
| TW | M556924 | 3/2018 |
| TW | 201939696 A | 10/2019 |
| TW | 202023014 A | 6/2020 |

OTHER PUBLICATIONS

Ng, et al. "Comprehensive Study in Mold Compound, Thermal Residual Stress, Package & Leadframe Geometry Influence towards Convex Cavity Package Warpage" (2014).

Nguyen, et al. "Leadframe Designs for Minimum Molding-Induced Warpage" (1994).

* cited by examiner

LEAD FRAME PACKAGE

CROSS-REFERENCE TO RELATED APPLICATIONS

This non-provisional application claims priority under 35 U.S.C. § 119(a) on Patent Application No(s). 109122628 filed in Taiwan, R.O.C. on Jul. 3, 2020, the entire contents of which are hereby incorporated by reference.

TECHNICAL FIELD

The disclosure relates to a package structure, more particularly to a lead frame package.

BACKGROUND

Due to the trend toward smaller and more lightweight electronic products having higher performance and capable of supporting multiple functions, the conventional IC packages and techniques are unable to meet the requirements of the electronic products. For this matter, a typical solution is to reduce the size or the quantity of the electrical components. Also, some of the components are integrated into a protective package to allow easy handling and assembly without affecting the function and stability of the electronic product.

Taking system-in-package (SiP) for example, it can consist of putting several components of different functions on one substrate according to the functions required by the system. Specifically, a Sip can be a package of a group of chips. Sip has evolved into 2D and 3D configurations. The 3D configuration of Sip involves techniques such as Stack Die and Package on Package (PoP) and is getting attention since it is slim in shape, low-cost and has high performance and high heterogeneous integration capability.

To realize vertical interconnections, the conventional manufacture of a Sip includes complex processes, such as via-hole drilling, plating, and adhesive providing. Thus, it is desirable to simplify the manufacturing processes of the package while achieving the required vertical interconnections.

SUMMARY

The disclosure provides a lead frame package that can be produced in a simple process while featuring the required vertical interconnections.

One embodiment of this disclosure provides a lead frame package including a first conductive layer, a first electronic component, a plurality of lead frames, a second conductive layer and a package body. The first conductive layer has a plurality of conductive carriers. The first electronic component has a plurality of first pins. The plurality of lead frames and the plurality of first pins of the first electronic component are respectively electrically connected to the plurality of conductive carriers of the first conductive layer. The second conductive layer has a plurality of conductive joints respectively electrically connected to the plurality of lead frames so as to be electrically connected to at least a part of the plurality of conductive carriers of the first conductive layer via the plurality of lead frames. The package body encapsulates the first conductive layer, the first electronic component, and the plurality of lead frames. The first conductive layer and the second conductive layer are located on two opposite sides of the first electronic component, respectively.

According to the lead frame package discussed in the above embodiments, the first conductive layer and the second conductive layer can be electrically connected to each other via the lead frames to realize the vertical interconnections, and thus there is no need to drill via-hole on the package body so that the conventional complex manufacturing processes, such as via-hole drilling, plating and adhesive providing on the package body are saved. As such, the manufacturing process of the lead frame package is simplified.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
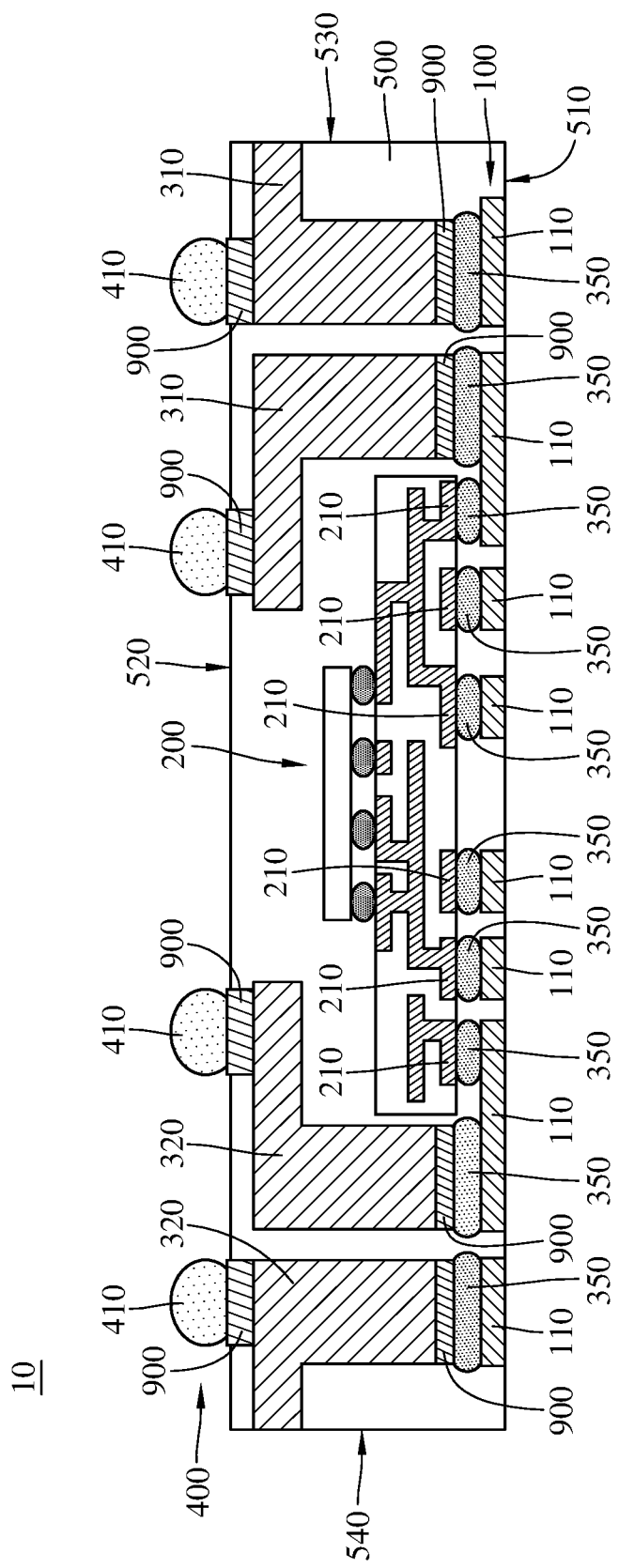
FIG. 1 is a cross-sectional view of a lead frame package according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, there is shown a cross-sectional view of a lead frame package according to a first embodiment of the disclosure.

This embodiment provides a lead frame package 10 including a first conductive layer 100, a first electronic component 200, a plurality of lead frames 310 and 320, a second conductive layer 400, and a package body 500.

The first conductive layer 100 is electrically conductive and has a plurality of conductive carriers 110. The conductive carriers 110 are pads made of electrically conductive material, such as gold, silver, or copper. The conductive carriers 110 are spaced apart and electrically insulated from one another.

The first electronic component 200 is, for example, an active device (e.g., a semiconductor chip), a passive device (e.g., a resistor, a capacitor or an inductor) or the combination thereof. The first electronic component 200 has a plurality of first pins 210 electrically connected to a part of the conductive carriers 110 via, for example, a plurality of soldering structures 350, respectively. The soldering structures 350 are, for example, solder balls or other electrically conductive metal balls.

The lead frames 310 and 320 are electrically conductive. The lead frames 310 and 320 and the first pins 210 of the first electronic component 200 are electrically connected to the conductive carriers 110 of the first conductive layer 100 via, for example, the soldering structures 350, respectively. In this embodiment, a part of the first pins 210 of the first electronic component 200 and a part of the lead frames 310 and 320 are electrically connected to the same conductive carrier 110 of the first conductive layer 100, and another part of the first pins 210 of the first electronic component 200 and another part of the lead frames 310 and 320 are electrically connected to different conductive carriers 110 of the first conductive layer 100, respectively. That is, some of the lead frames 310 and 320 are electrically connected to one another by being connected to some of the first pins 210 of the first electronic component 200 via the conductive carriers 110 of the first conductive layer 100, and some of the lead frames 310 and 320 are not electrically connected to one another because they are not electrically connected to the first pins 210 of the first electronic component 200 via the conductive carriers 110 of the first conductive layer 100.

In this embodiment, the lead frames 310 and 320 are formed by, for example, etching, but the disclosure is not limited thereto. In other embodiments, the lead frames 310 and 320 may be a sheet metal plate formed by bending or may be formed by a stamping process.

In this embodiment, the lead frames 310 and 320 include a plurality of first lead frames 310 and a plurality of second lead frames 320 depending on their locations. The first lead frames 310 and the second lead frames 320 are located on two opposite sides of the first electronic component 200, respectively, but their locations are exemplary and not intended to limit the disclosure in any aspect. In other embodiments, the first lead frames 310 and the second lead frames 320 may be located on the same side of the first electronic component 200 or may be respectively located on adjacent sides of the first electronic component 200.

The second conductive layer 400 and the first conductive layer 100 are located on two opposite sides of the first electronic component 200, respectively. The second conductive layer 400 has a plurality of conductive joints 410. Each conductive joint 410 is made of electrically conductive material, such as Tin, and is in the form of, for example, ball. The conductive joints 410 are respectively electrically connected to the lead frames 310 and 320 so as to be electrically connected to the conductive carriers 110 of the first conductive layer 100.

Note that the shape of the conductive joints 410 of the second conductive layer 400 is exemplary and not intended to limit the disclosure. In other embodiments, like the conductive carriers of the first conductive layer, the conductive joints of the second conductive layer may also be metal pads made of gold, silver or copper.

The package body 500 is made of, for example, Novolac-based resin, Epoxy-based resin, Silicone-based resin or other suitable molding compounds. The package body 500 encapsulates the first conductive layer 100, the second conductive layer 400, the first electronic component 200, and the lead frames 310 and 320.

As shown, the first conductive layer 100 and the second conductive layer 400 can be electrically connected to each other via the lead frames 310 and 320 to realize the vertical interconnections, and thus there is no need to drill via-hole on the package body 500 so that the complex manufacturing processes, such as via-hole drilling, plating and adhesive providing on the package body 500 are saved. As such, the manufacturing process of the lead frame package 10 is simplified.

In addition, in this embodiment, the conductive carriers 110 of the first conductive layer 100 and the conductive joints 410 of the second conductive layer 400 are exposed to the outside, such that both sides of the lead frame package 10 are able to be electrically connected to one or more external packages. Specifically, the package body 500 has a first side surface 510, a second side surface 520, a third side surface 530, and a fourth side surface 540, where the first side surface 510 and the second side surface 520 are located opposite to each other, and the third side surface 530 and the fourth side surface 540 are located opposite to each other and located between the first side surface 510 and the second side surface 520. The conductive carriers 110 of the first conductive layer 100 are exposed from the first side surface 510 of the package body 500, and the conductive joints 410 of the second conductive layer 400 are exposed from the second side surface 520 of the package body 500, such that the upper and lower sides of the lead frame package 10 are able to be electrically connected to one or more external packages respectively via the first conductive layer 100 and the second conductive layer 400.

Further, in this embodiment, a part of the first lead frames 310 is exposed from the third side surface 530 of the package body 500, and a part of the second lead frames 320 is exposed from the fourth side surface 540 of the package body 500, such that the left and right sides of the lead frame package 10 are able to be electrically connected to one or more external packages respectively via the exposed first lead frame 310 and the exposed second lead frame 320. As discussed, the external packages can be arranged side by side with the lead frame package 10 and electrically connected to the lead frame package 10 in horizontal manner.

In this embodiment, all of the conductive carriers 110 of the first conductive layer 100 and all of the conductive joints 410 of the second conductive layer 400 are exposed to the outside, but the disclosure is not limited thereto. In other embodiments, only a part of the conductive carriers of the first conductive layer and only a part of the conductive joints of the second conductive layer may be exposed to the outside.

In this embodiment, a part of the first lead frames 310 is exposed and a part of the second lead frames 320 are exposed to the outside, but the disclosure is not limited thereto. In other embodiments, there may be no first lead frame and second lead frame exposed to the outside. The lead frames 310 and 320 are electrically connected to the conductive carriers 110 of the first conductive layer 100 via the soldering structures 350 respectively, but the disclosure is not limited thereto.

In this embodiment, both of the first conductive layer 100 and the second conductive layer 400 are exposed to the outside, such that both sides of the lead frame package 10 can be electrically connected to one or more external packages in vertical manner, but the disclosure is not limited thereto, and this is described later.

In this embodiment, the lead frame package 10 may further include a plurality of metal pads 900 made of, for example, aluminum. The lead frames 310 and 320 are made of, for example, copper. The lead frames 310 and 320 are electrically connected to the soldering structures 350 via the metal pads 900, respectively, and are electrically connected to the conductive joints 410 of the second conductive layer 400 via the metal pads 900, respectively. It is easier to create bonding between the soldering structures 350 and the conductive joints 410 of the second conductive layer 400 and the aluminum-made metal pads 900, and thus the additional usage of the metal pads 900 is able to increase the reliability of the electrical connection between the lead frames 310 and 320, the soldering structures 350, and the second conductive layer 400. However, in other embodiments, the lead frames 310 and 320 may not be made of copper but be made of a material (e.g., aluminum) suitable to be bonded to the first conductive layer 100 and the second conductive layer 400, and the metal pads 900 may be omitted to let the lead frames 310 and 320 to directly electrically connect the soldering structures 350 and the second conductive layer 400.

Figure 2:
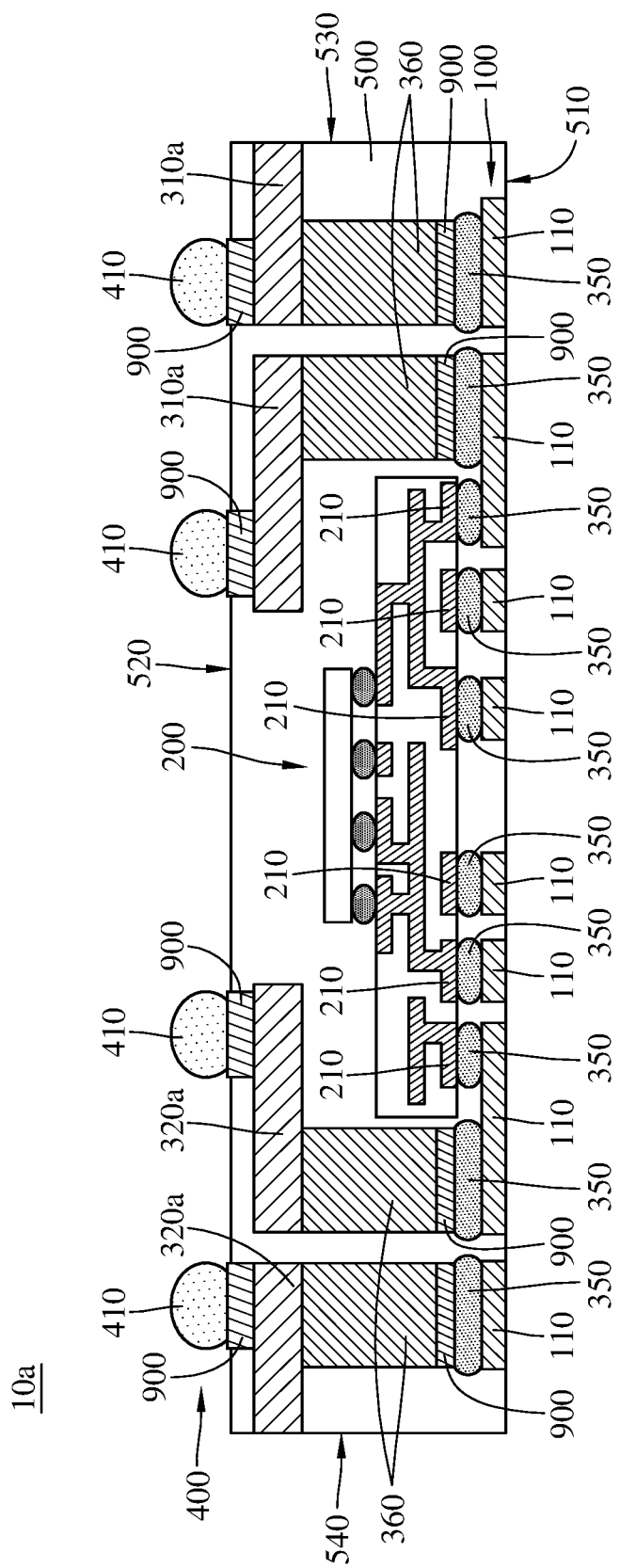
FIG. 2 is a cross-sectional view of a lead frame package according to a second embodiment of the disclosure.

Please refer to FIG. 2, there is shown a cross-sectional view of a lead frame package according to a second embodiment of the disclosure.

This embodiment provides a lead frame package 10a including a first conductive layer 100, a first electronic component 200, a plurality of lead frames 310a and 320a, a second conductive layer 400 and a package body 500. The first conductive layer 100, the first electronic component 200, the second conductive layer 400 and the package body 500 provided by this embodiment and those provided by the embodiment shown in FIG. 1 are similar in structure, and thus only the difference therebetween is described in detail hereinafter. In this embodiment, each lead frame 310a and 320a is electrically connected to a corresponding conductive carrier 110 of the first conductive layer 100 via a soldering structure 350 and a conductive pillar 360. The soldering structures 350 are, for example, soldering tins having low melting point, and the conductive pillars 360 are, for example, electrically conductive copper pillars having high melting point. Since the electrically conductive copper pillars having high melting point can hardly be soldered to the conductive carriers 110, the conductive pillars 360 are electrically connected to the conductive carriers 110 additionally via the soldering structures 350. Also, comparing to the lead frames 310a and 320a, the conductive pillars 360 can provide higher density of vertical interconnections, thereby improving the integrity of the package.

In this embodiment, the lead frame package 10a may further include a plurality of metal pads 900 made of, for example, aluminum. The lead frames 310a and 320a are made of, for example, copper, and the lead frames 310a and 320a are electrically connected to the second conductive layer 400 via the metal pads 900, respectively. The conductive pillars 360 are electrically connected to the soldering structures 350 via the metal pads 900, respectively. It is easier to create bonding between the soldering structures 350 and the conductive joints 410 of the second conductive layer 400 and the aluminum-made metal pads 900, and thus the additional usage of the metal pads 900 is able to increase the reliability of the electrical connection between the lead frames 310a and 320a and the second conductive layer 400, and that between the conductive pillars 360 and the soldering structures 350. However, in other embodiments, the lead frames 310a and 320a and the conductive pillars 360 may not be made of copper but be made of a material (e.g., aluminum) suitable to be bonded to the soldering structures 350 and the second conductive layer 400, and the metal pads 900 may be omitted to let the lead frames 310a and 320a and the conductive pillars 360 to directly electrically connect the soldering structures 350 and the second conductive layer 400.

Figure 3:
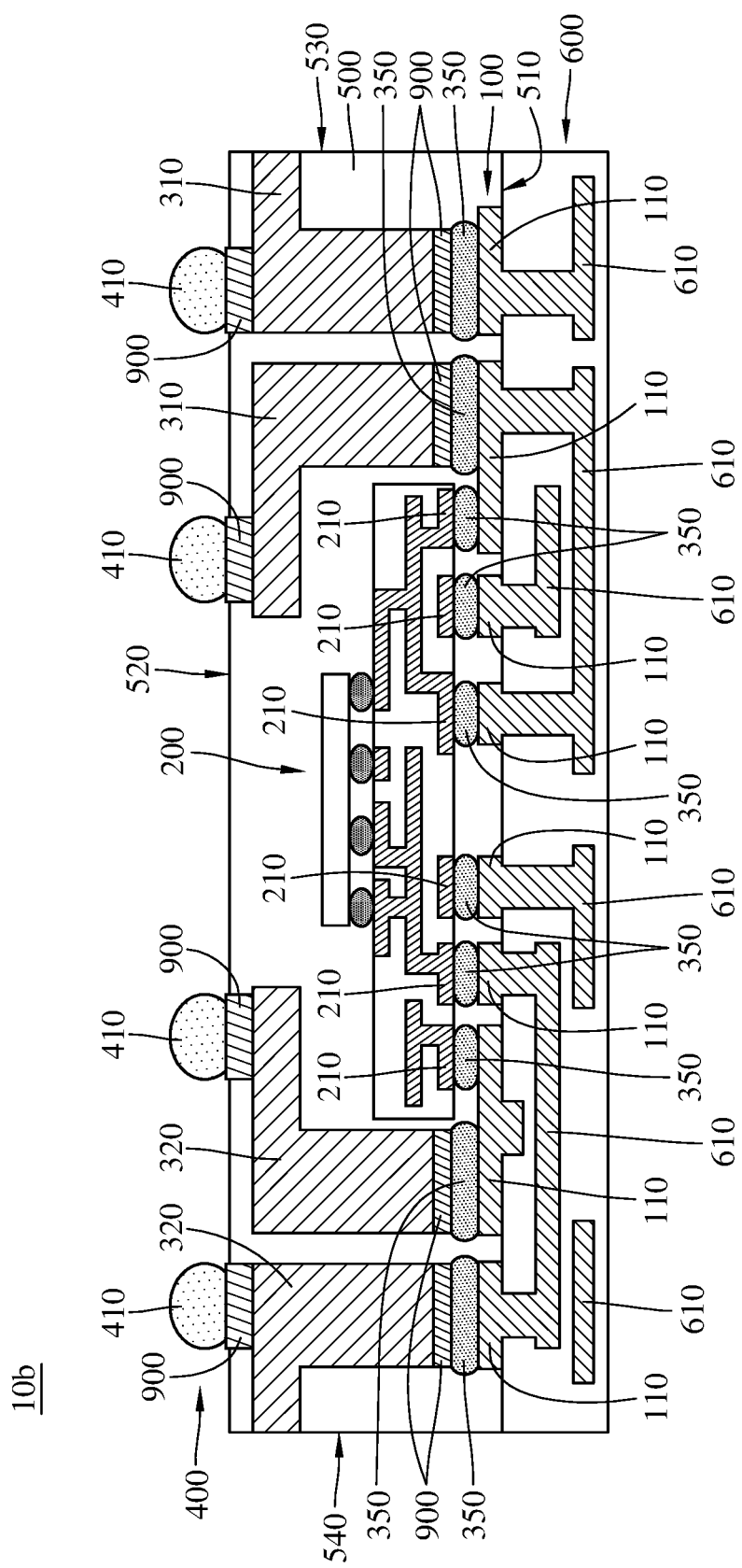
FIG. 3 is a cross-sectional view of a lead frame package according to a third embodiment of the disclosure.

Please refer to FIG. 3, there is shown a cross-sectional view of a lead frame package according to a third embodiment of the disclosure.

Besides a first conductive layer 100, a first electronic component 200, a plurality of lead frames 310 and 320, a second conductive layer 400, a package body 500 and a plurality of metal pads 900, a lead frame package 10b provided by this embodiment may further include a circuit board 600. The first conductive layer 100 is formed on the circuit board 600. The circuit board 600 has a plurality of inner lines 610. In addition, at least some of the conductive carriers 110 are electrically connected to one another via the inner lines 610, respectively. Specifically, in the lead frame package 10b provided by this embodiment, only the second conductive layer 400 is exposed to the outside, such that only one side of the lead frame package 10b is electrically connected to one or more external packages in vertical manner. In addition, in this embodiment, a part of the first lead frames 310 is exposed from the third side surface 530 of the package body 500, and a part of the second lead frames 320 is exposed from the fourth side surface 540 of the package body 500, such that left and right sides of the lead frame package 10b are electrically connected to one or more external packages via the exposed first lead frames 310 and the exposed second lead frames 320, respectively. As discussed, the external packages can be arranged side by side with the lead frame package 10b and electrically connected to the lead frame package 10 in horizontal manner.

In this embodiment, the first conductive layer 100 is covered by the circuit board 600, such that only one side of the lead frame package 10b can be electrically connected to one or more external packages in vertical manner, but the disclosure is not limited thereto, and this is described later.

Figure 4:
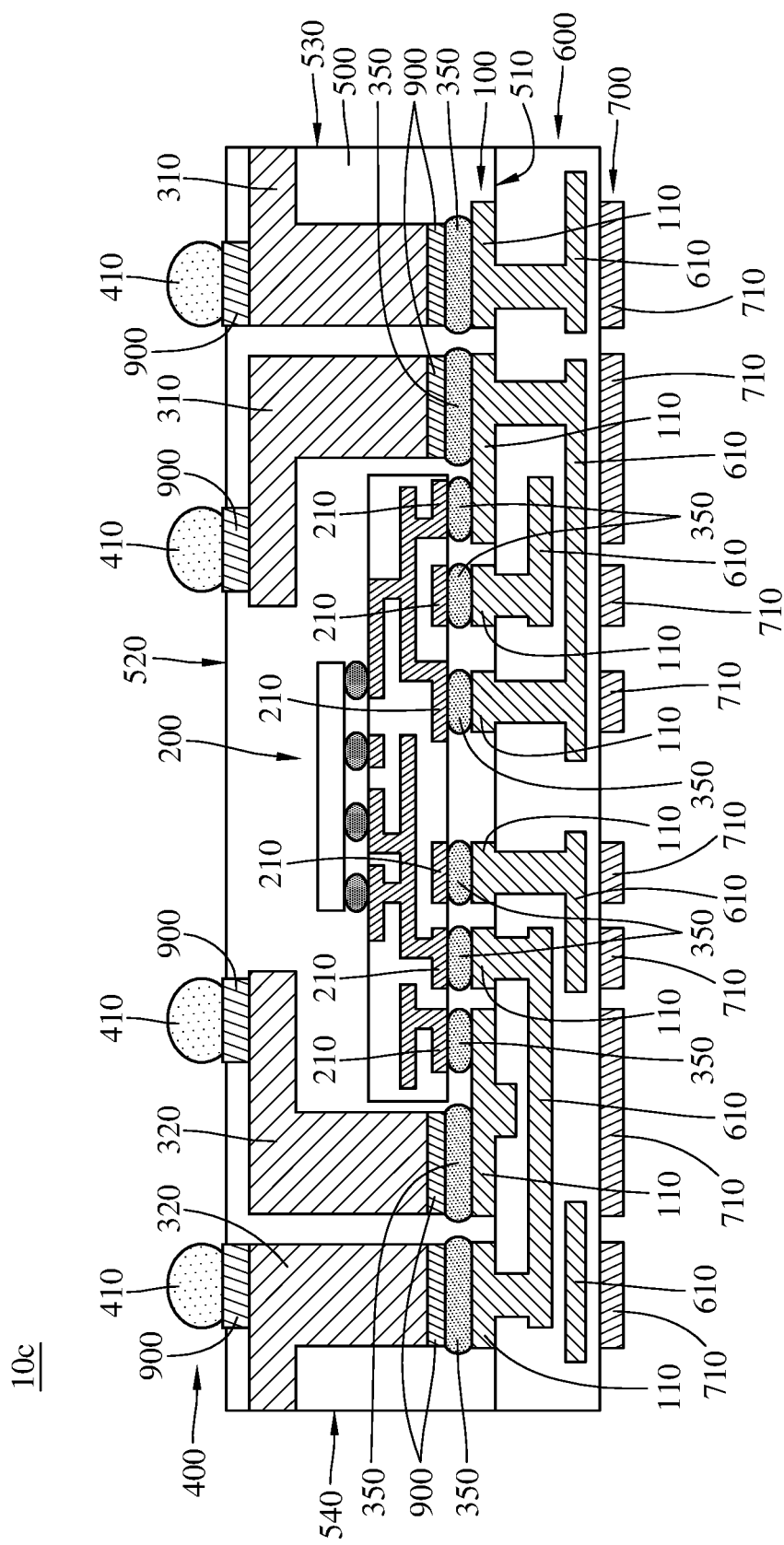
FIG. 4 is a cross-sectional view of a lead frame package according to a fourth embodiment of the disclosure.

Please refer to FIG. 4, there is shown a cross-sectional view of a lead frame package according to a fourth embodiment of the disclosure.

Besides a first conductive layer 100, a first electronic component 200, a plurality of lead frames 310 and 320, a second conductive layer 400, a package body 500, a circuit board 600 and a plurality of metal pads 900, a lead frame package 10c provided by this embodiment may further include a third conductive layer 700. The third conductive layer 700 is formed on a side of the circuit board 600 that is located away from the first conductive layer 100, and has a plurality of outer conductive joints 710 that are electrically conductive. The outer conductive joints 710 of the third conductive layer 700 are electrically connected to the conductive carriers 110 of the first conductive layer 100 via the inner lines 610 of the circuit board 600, respectively. In this way, although the first conductive layer 100 is covered by the circuit board 600, both sides of the lead frame package 10c still can be electrically connected to one or more external packages via the first conductive layer 100 and the third conductive layer 700 in vertical manner.

In this embodiment, the outer conductive joints 710 of the third conductive layer 700 are electrically connected to the second conductive layer 400 via the inner lines 610 of the circuit board 600, the first conductive layer 100 and the lead frames 310 and 320, but the disclosure is not limited thereto, and this is described later.

Figure 5:
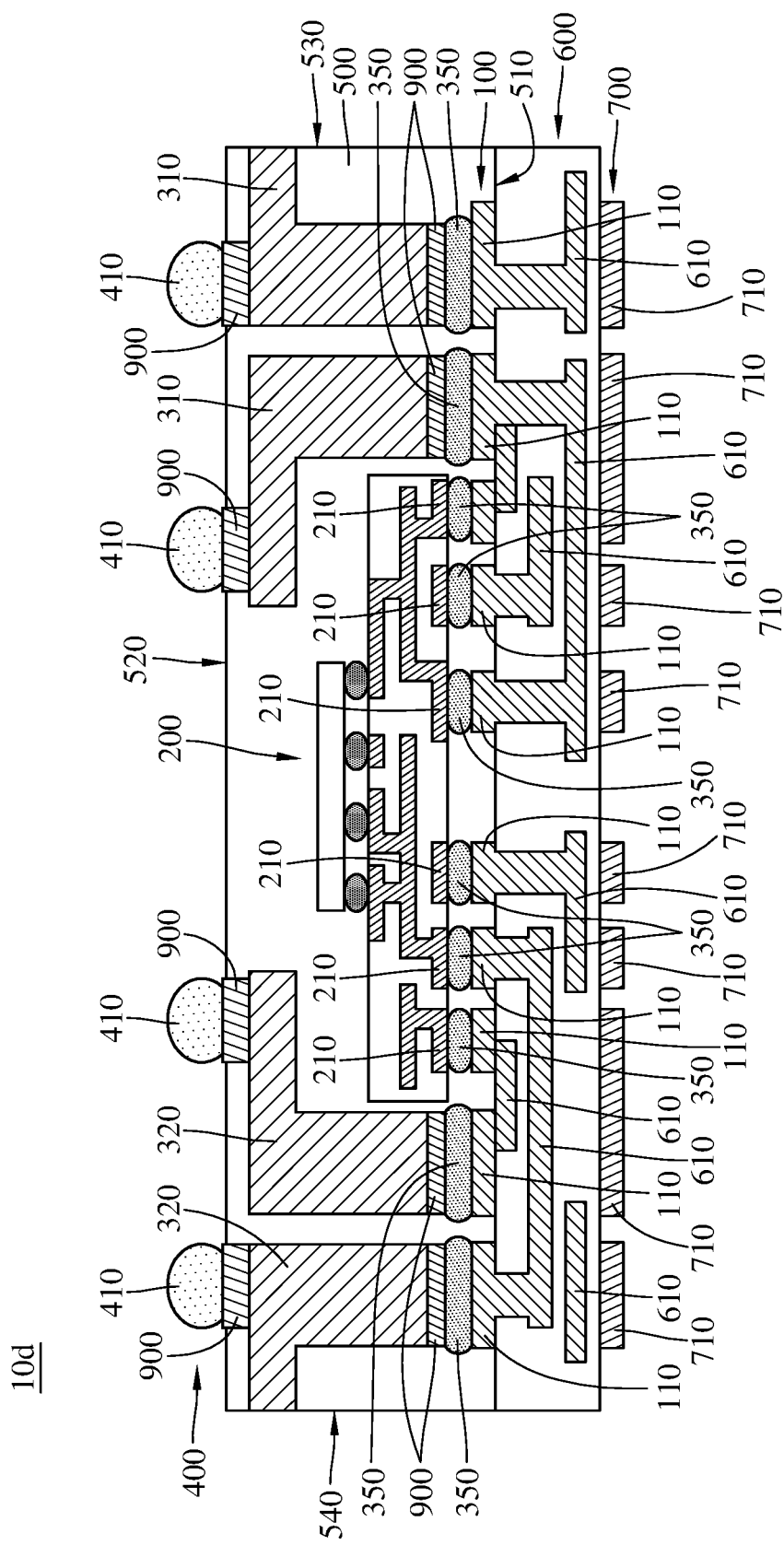
FIG. 5 is a cross-sectional view of a lead frame package according to a fifth embodiment of the disclosure.

Please refer to FIG. 5, there is shown a cross-sectional view of a lead frame package according to a fifth embodiment of the disclosure. In a lead frame package 10d provided by this embodiment, a plurality of first pins 210 of a first electronic component 200 and a plurality of lead frames 310 and 320 are electrically connected to different conductive carriers 110 of a first conductive layer 100, respectively, and some of the conductive carriers 110 are electrically connected to one another via a plurality of inner lines 610 of a circuit board 600. That is, without the circuit board 600, the first pins 210 of the first electronic component 200 are not electrically connected to the lead frames 310 and 320.

Figure 6:
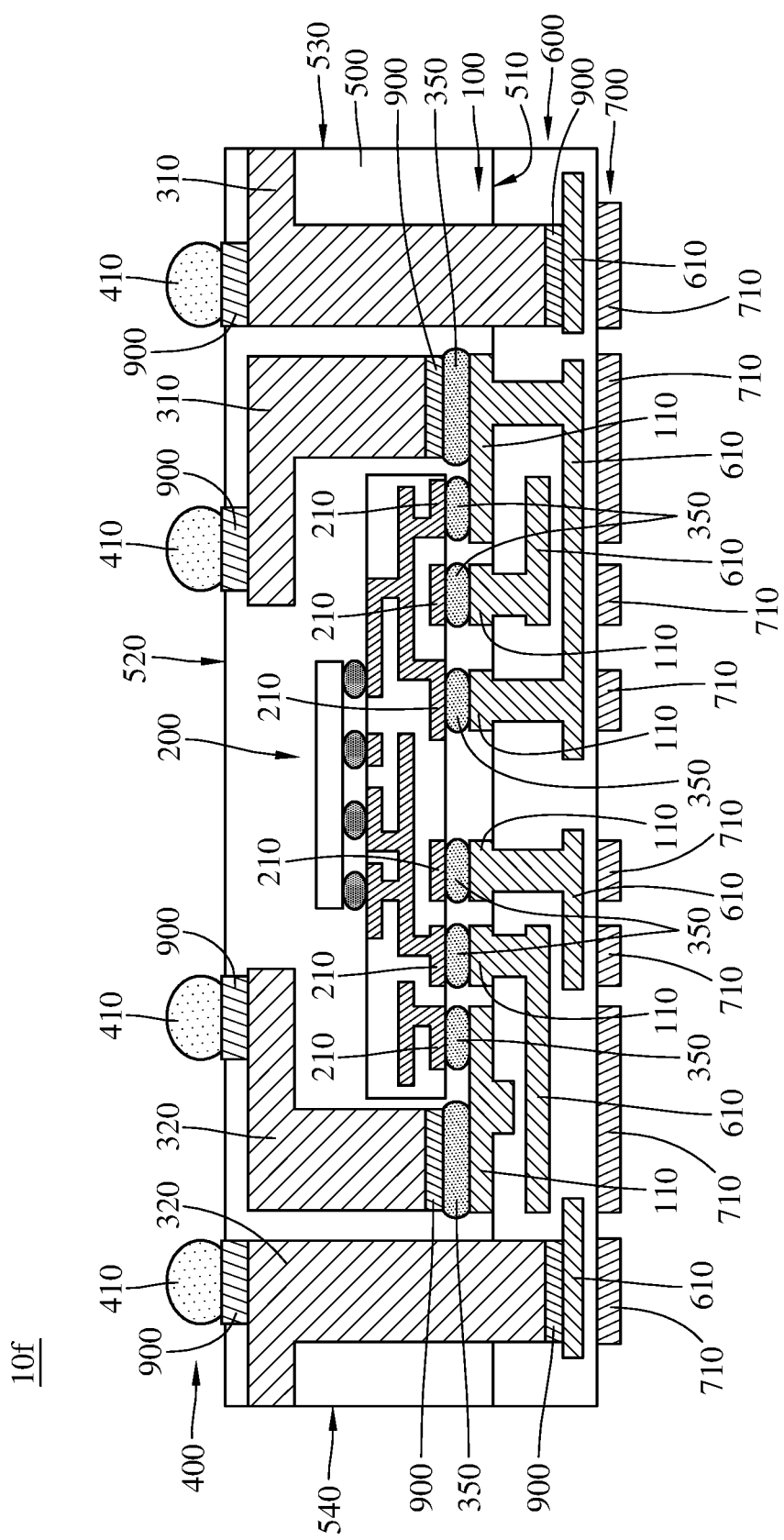
FIG. 6 is a cross-sectional view of a lead frame package according to a sixth embodiment of the disclosure.

Please refer to FIG. 6, there is shown a cross-sectional view of a lead frame package according to a sixth embodiment of the disclosure. In a lead frame package 10f provided by this embodiment, an outer first lead frame 310 and an outer second lead frame 320 are inserted into a circuit board 600 and are electrically connected to a plurality of inner lines 610 of the circuit board 600. That is, a part of a plurality of outer conductive joints 710 of a third conductive layer 700 is electrically connected to the second conductive layer 400 only via the lead frames 310 and 320 and the inner lines 610, and the first conductive layer 100 is not included in the electrically conductive path of that part of the outer conductive joints 710.

In this embodiment, the lead frame package 10f may further include a plurality of metal pads 900 made of, for example, aluminum. The lead frames 310 and 320 are made of, for example, copper, and the lead frames 310 and 320 are electrically connected to a plurality of soldering structures 350, the second conductive layer 400 and the inner lines 610 via the metal pads 900, respectively, and the reasons to use the metal pads 900 for electrical connection are described in the aforementioned embodiments so that the descriptions thereof are omitted.

Figure 7:
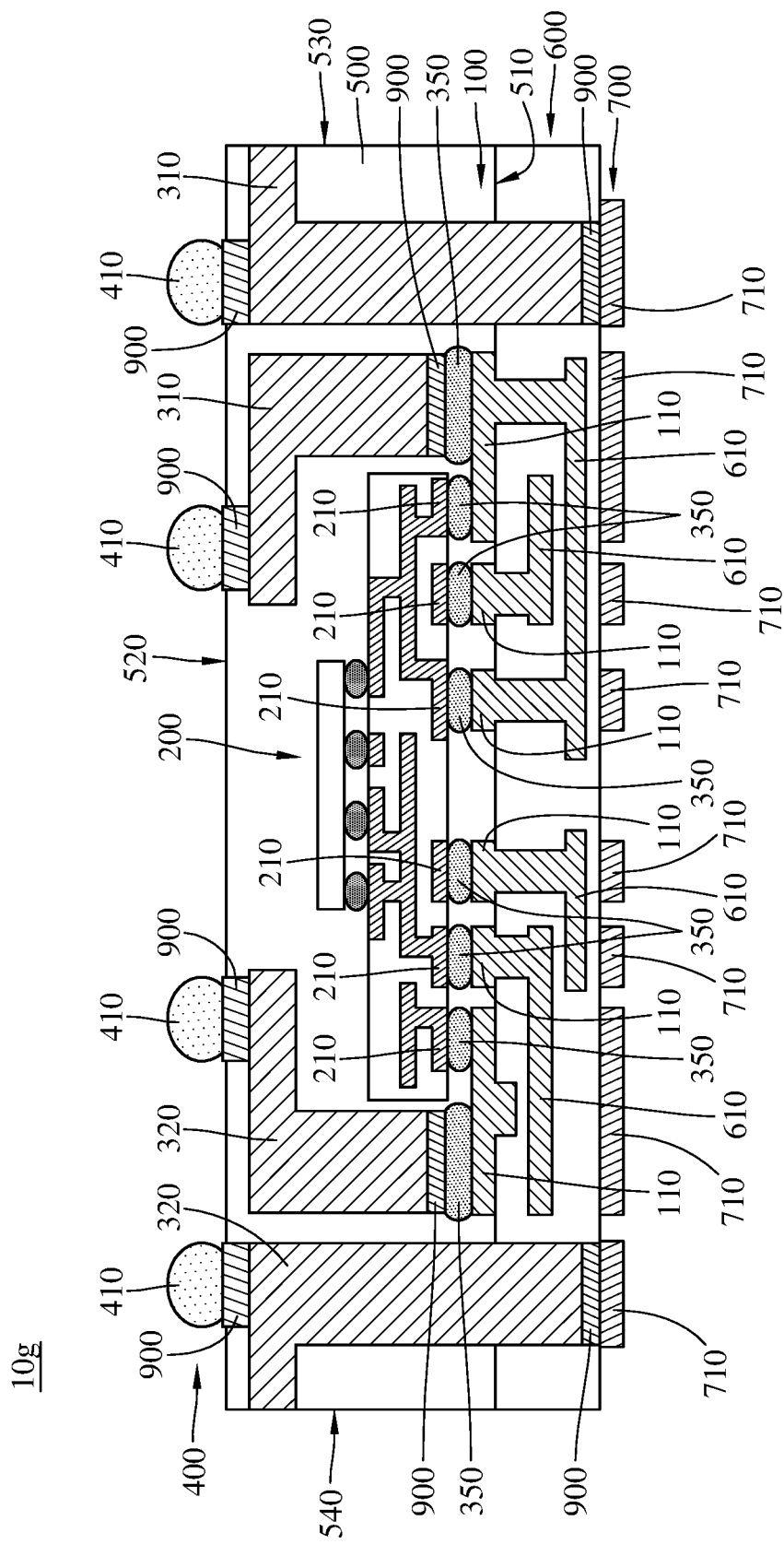
FIG. 7 is a cross-sectional view of a lead frame package according to a seventh embodiment of the disclosure.

Please refer to FIG. 7, there is shown a cross-sectional view of a lead frame package according to a seventh embodiment of the disclosure. In a lead frame package 10g provided by this embodiment, an outer first lead frames 310 and an outer second lead frames 320 are inserted into a circuit board 600 and are electrically connected to a plurality of outer conductive joints 710 of a third conductive layer 700. That is, a part of the outer conductive joints 710 of the third conductive layer 700 is electrically connected to a second conductive layer 400 only via the lead frames 310 and 320, and the first conductive layer 100 and a plurality of inner lines 610 of the circuit board 600 are not included in the electrically conductive path of that part of the outer conductive joints 710.

In this embodiment, the lead frame package 10g may further include a plurality of metal pads 900 made of, for example, aluminum. The lead frames 310 and 320 are made of, for example, copper, and the lead frames 310 and 320 are electrically connected to a plurality of soldering structures 350, the second conductive layer 400 and the outer conductive joints 710 via the metal pads 900, respectively, and the reasons to use the metal pads 900 for electrical connection are described in the aforementioned embodiments so that the descriptions thereof are omitted.

Figure 8:
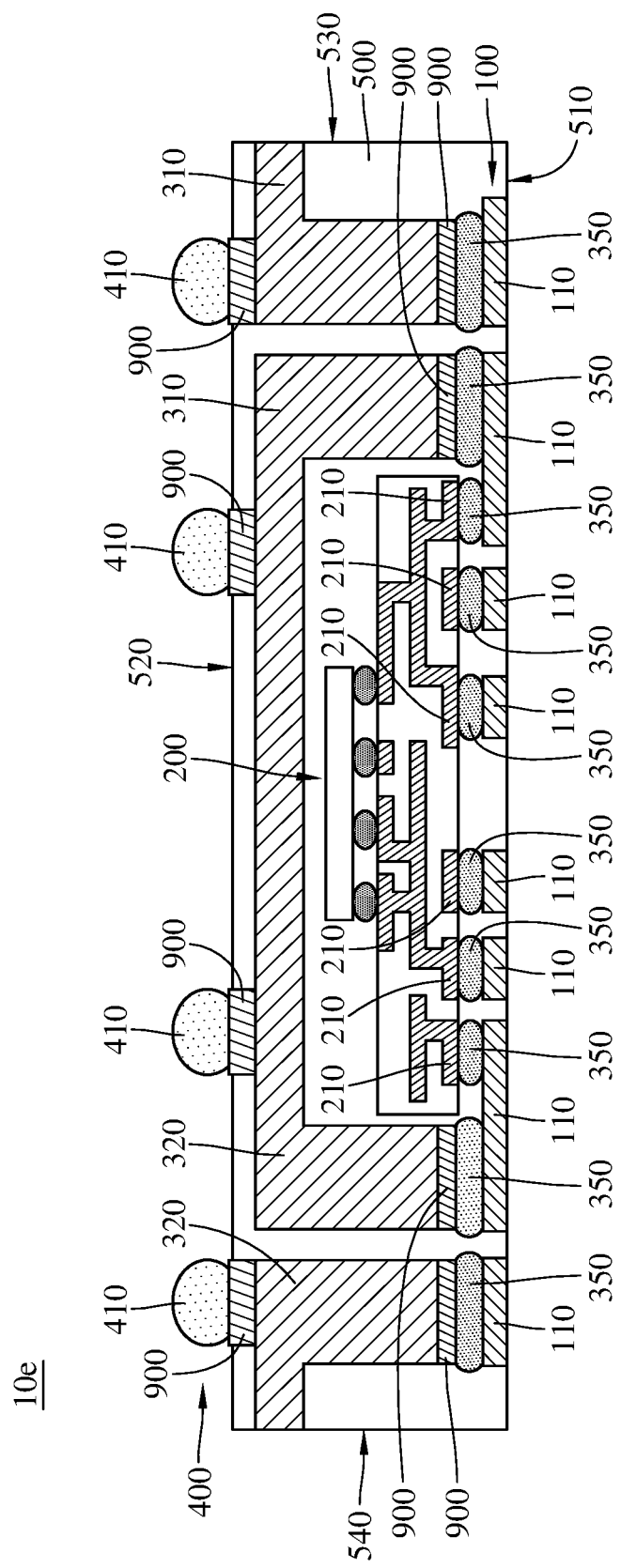
FIG. 8 is a cross-sectional view of a lead frame package according to an eighth embodiment of the disclosure.

Please refer to FIG. 8, there is shown a cross-sectional view of a lead frame package according to an eighth embodiment of the disclosure. In a lead frame package 10e provided by this embodiment, a plurality of lead frames 310 and 320 include a plurality of first lead frames 310 and a plurality of second lead frames 320 depending on their locations. The first lead frames 310 and the second lead frames 320 are located on two opposite sides of the first electronic component 200, respectively, and the first lead frame 310 that is located close to the center of the lead frame package 10e and the second lead frame 320 that is located close to the center of the lead frame package 10e are electrically connected to each other and cross the first electronic component 200. That is, a part of the first lead frames 310 and a part of the second lead frames 320 are directly connected to each other so as to cross the first electronic component 200, thereby allowing the wiring of the circuit board to be simplified.

Figure 9:
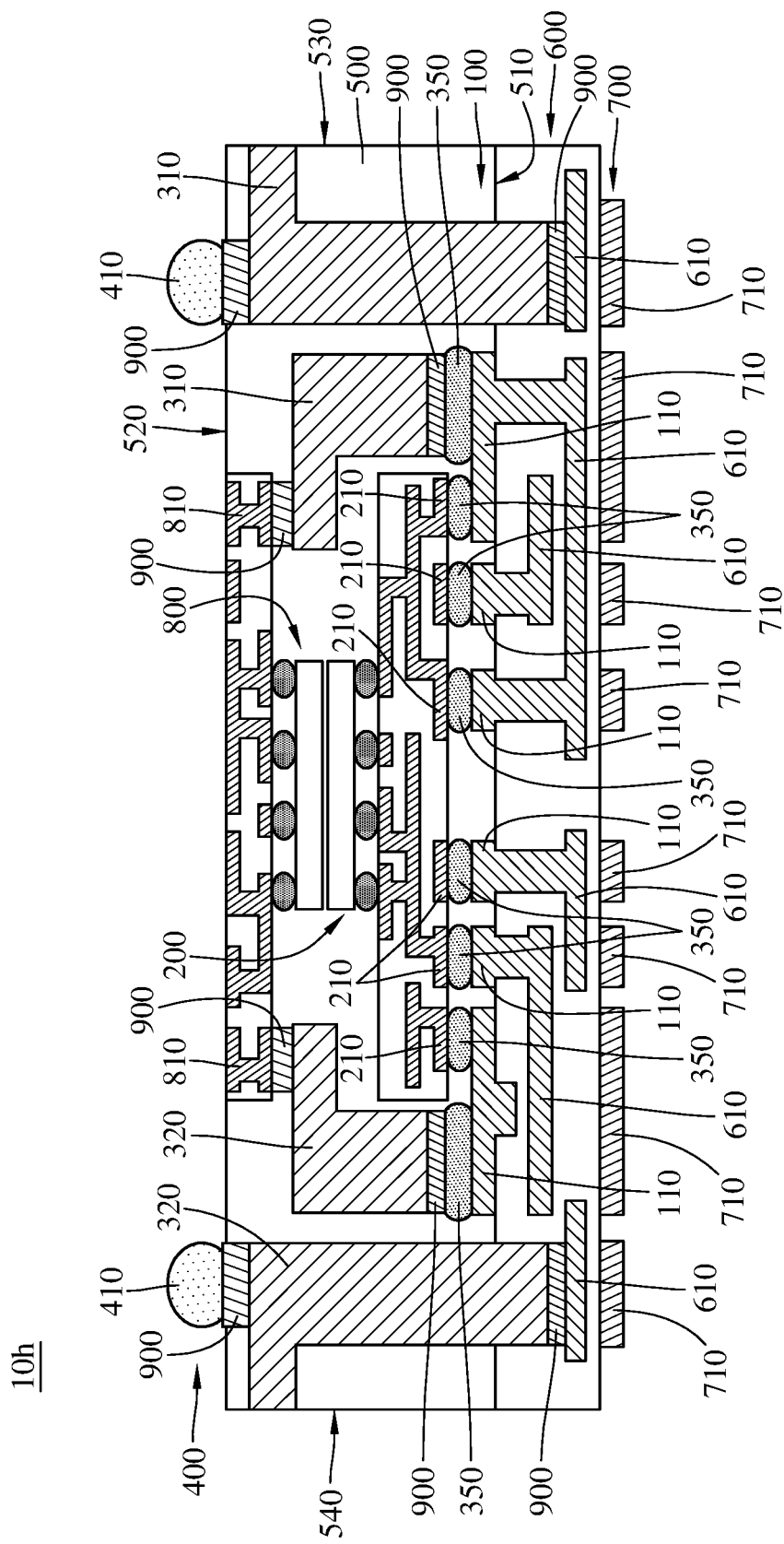
FIG. 9 is a cross-sectional view of a lead frame package according to a ninth embodiment of the disclosure.

Please refer to FIG. 9, there is shown a cross-sectional view of a lead frame package according to a ninth embodiment of the disclosure.

As shown in FIG. 9, a lead frame package 10h provided by this embodiment may further include a second electronic component 800. A first electronic component 200 is located between the second electronic component 800 and a first conductive layer 100, and the second electronic component 800 has a plurality of second pins 810. The second pins 810 of the second electronic component 800 are electrically connected to ends of a plurality of inner lead frames 310 and 320 that are located away from the first conductive layer 100, where the inner lead frames 310 and 320 are located close to the center of the lead frame package 10h. Also, the second electronic component 800 is located further away from the first conductive layer 100 than ends of the lead frames 310 and 320 that are located away from the first conductive layer 100. Moreover, the second electronic component 800 is encapsulated by a package body 500.

In this embodiment, the lead frame package 10h may further include a plurality of metal pads 900 that are made of, for example, aluminum. The lead frames 310 and 320 are made of, for example, copper, and the lead frames 310 and 320 are electrically connected to a plurality of soldering structures 350, a second conductive layer 400 and a plurality of inner lines 610 via the metal pads 900, respectively, and the reasons to use the metal pads 900 for electrical connection are described in the aforementioned embodiments so that the descriptions thereof are omitted Please refer to FIG. 10, there is shown a cross-sectional view of a lead frame package according to a tenth embodiment of the disclosure.

Figure 10:
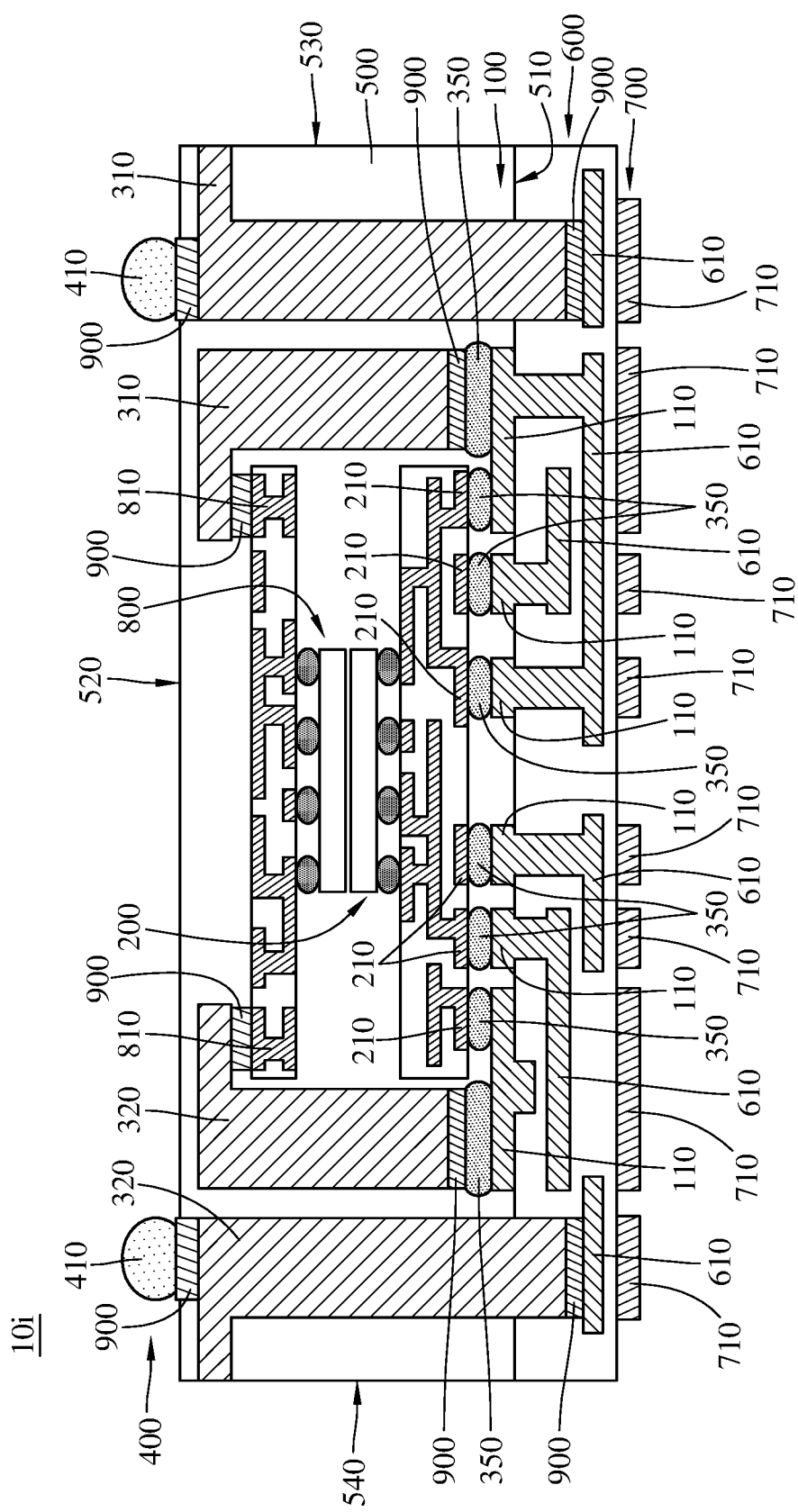
FIG. 10 is a cross-sectional view of a lead frame package according to a tenth embodiment of the disclosure.

As shown in FIG. 10, a lead frame package 10i provided by this embodiment may further include a second electronic component 800. A first electronic component 200 is located between the second electronic component 800 and a first conductive layer 100, and the second electronic component 800 has a plurality of second pins 810. The second pins 810 of the second electronic component 800 are electrically connected to ends of a plurality of inner lead frames 310 and 320 that are located away from the first conductive layer 100, where the inner lead frames 310 and 320 are located close to the center of the lead frame package 10h. Also, the second electronic component 800 is located closer to the first conductive layer 100 than ends of the lead frames 310 and 320 that are located away from the first conductive layer 100. In addition, the second electronic component 800 is encapsulated by a package body 500.

Figure 11:
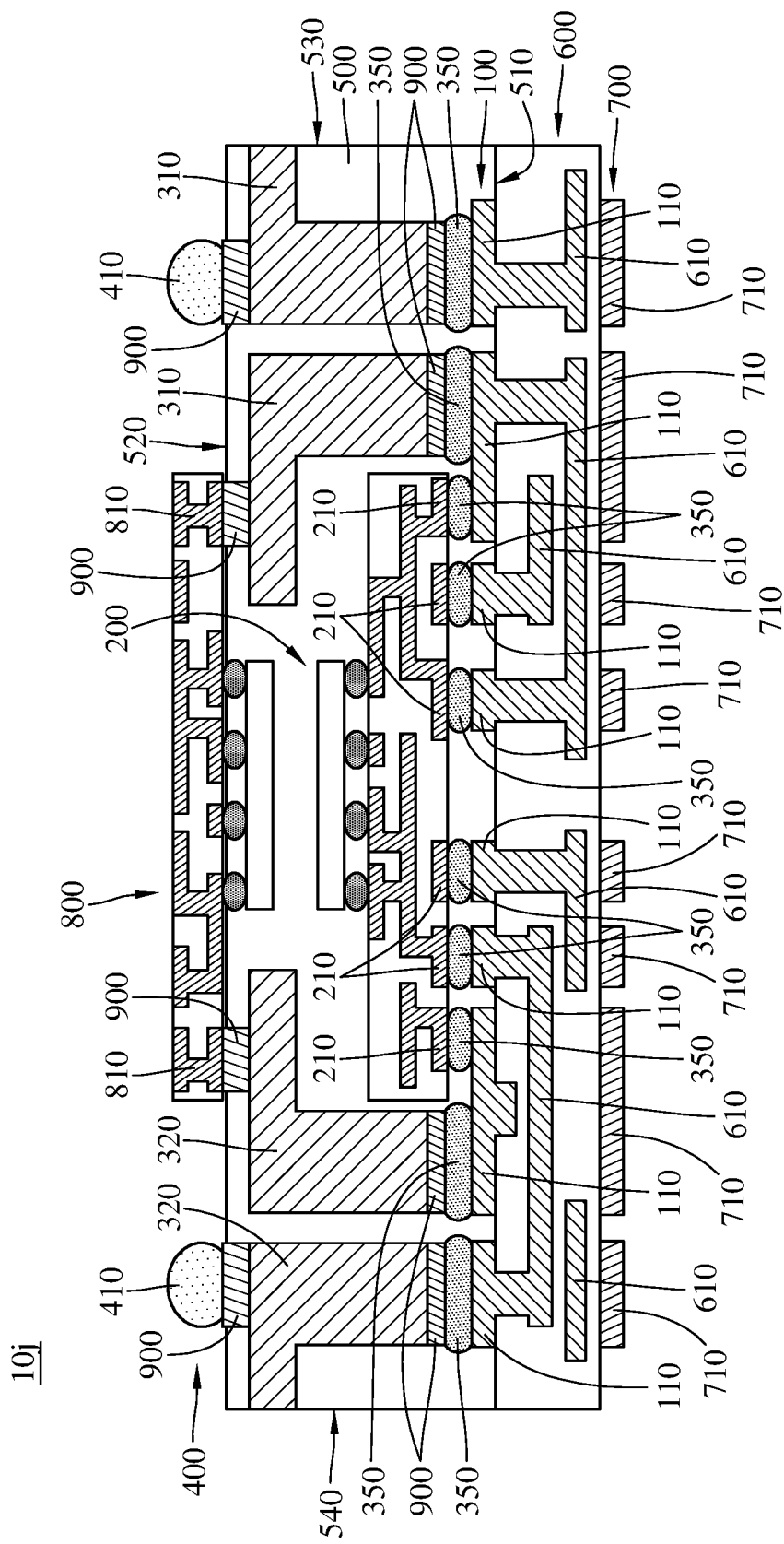
FIG. 11 is a cross-sectional view of a lead frame package according to an eleventh embodiment of the disclosure.

Please refer to FIG. 11, there is shown a cross-sectional view of a lead frame package according to an eleventh embodiment of the disclosure.

As shown in FIG. 11, a lead frame package 10j provided by this embodiment may further include a second electronic component 800. A first electronic component 200 is located between the second electronic component 800 and a first conductive layer 100, and the second electronic component 800 has a plurality of second pins 810. The second pins 810 of the second electronic component 800 are electrically connected to ends of a plurality of inner lead frames 310 and 320 that are located away from the first conductive layer 100, where the inner lead frames 310 and 320 are located close to the center of the lead frame package 10h. Also, the second electronic component 800 is located further away from the first conductive layer 100 than ends of the lead frames 310 and 320 that are located away from the first conductive layer 100. Moreover, the second electronic component 800 is located outside a package body 500.

According to the lead frame package discussed in the above embodiments, the first conductive layer and the second conductive layer can be electrically connected to each other via the lead frames to realize the vertical interconnections, and thus there is no need to drill via-hole on the package body so that the complex manufacturing processes, such as via-hole drilling, plating and adhesive providing on the package body are saved. As such, the manufacturing process of the lead frame package is simplified.

In addition, in some embodiments, since the conductive carriers of the first conductive layer and the conductive joints of the second conductive layer are exposed to the outside, upper and lower sides of the lead frame package are able to be electrically connected to external packages in vertical manner.

Further, in some embodiments, since the conductive carriers of the first conductive layer and the outer conductive joint of the third conductive layer are exposed to the outside, upper and lower sides of the lead frame package are able to be electrically connected to external packages in vertical manner.

Moreover, in some embodiments, since some of the first lead frames and the second lead frames are exposed to the outside, left and right sides of the lead frame package are able to be electrically connected to external packages in horizontal manner.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A lead frame package, comprising:
   a first conductive layer having a plurality of conductive carriers;
   a first electronic component having a plurality of first pins;
   a plurality of lead frames, wherein the plurality of lead frames and the plurality of first pins of the first electronic component are respectively electrically connected to the plurality of conductive carriers of the first conductive layer;
   a second conductive layer having a plurality of conductive joints respectively electrically connected to the plurality of lead frames so as to be electrically connected to at least a part of the plurality of conductive carriers of the first conductive layer via the plurality of lead frames; and
   a package body, encapsulating the first conductive layer, the first electronic component, and the plurality of lead frames;
   wherein the first conductive layer and the second conductive layer are located on two opposite sides of the first electronic component, respectively.

2. The lead frame package according to claim 1, wherein at least a part of the plurality of conductive carriers of the first conductive layer is exposed, and at least a part of the plurality of conductive joints of the second conductive layer is exposed.

3. The lead frame package according to claim 1, wherein at least a part of the plurality of first pins of the first electronic component and at least a part of the plurality of lead frames are connected to one of the plurality of the conductive carriers of the first conductive layer, and another part of the plurality of first pins of the first electronic component and another part of the plurality of lead frames are electrically connected to different ones of the plurality of conductive carriers of the first conductive layer, respectively.

4. The lead frame package according to claim 3, further comprising a circuit board, wherein the first conductive layer is formed on the circuit board, the circuit board has a plurality of inner lines, and at least some of the plurality of conductive carriers are electrically connected via the first conductive layer and the plurality of inner lines.

5. The lead frame package according to claim 4, further comprising a third conductive layer, wherein the third conductive layer is formed on a side of the circuit board located away from the first conductive layer and has a plurality of outer conductive joints, and the plurality of outer conductive joints of the third conductive layer are electrically connected to the plurality of conductive carriers of the first conductive layer via the plurality of inner lines, respectively.

6. The lead frame package according to claim 4, further comprising a third conductive layer, wherein the third conductive layer is formed on a side of the circuit board located away from the first conductive layer and has a plurality of outer conductive joints, and at least a part of the plurality of outer conductive joints of the third conductive layer are electrically connected to the second conductive layer only via the plurality of lead frames and the plurality of inner lines.

7. The lead frame package according to claim 4, further comprising a third conductive layer, wherein the third conductive layer is formed on a side of the circuit board located away from the first conductive layer and has a plurality of outer conductive joints, and at least a part of the plurality of outer conductive joints of the third conductive layer are electrically connected to the second conductive layer only via the plurality of lead frames.

8. The lead frame package according to claim 1, wherein the plurality of first pins of the first electronic component and the plurality of lead frames are electrically connected to different ones of the plurality of conductive carriers of the first conductive layer, respectively.

9. The lead frame package according to claim 8, further comprising a circuit board, wherein the first conductive layer is formed on the circuit board, the circuit board has a plurality of inner lines, and the plurality of first pins of the first electronic component and the plurality of lead frames are electrically connected via the plurality of inner lines, respectively.

10. The lead frame package according to claim 9, further comprising a third conductive layer, wherein the third conductive layer is formed on a side of the circuit board located away from the first conductive layer and has a plurality of outer conductive joints, and the plurality of outer conductive joints of the third conductive layer are electrically connected to the plurality of conductive carriers of the first conductive layer via the plurality of inner lines, respectively.

11. The lead frame package according to claim 9, further comprising a third conductive layer, wherein the third conductive layer is formed on a side of the circuit board located away from the first conductive layer and has a plurality of outer conductive joints, and at least a part of the plurality of outer conductive joints of the third conductive layer are electrically connected to the second conductive layer only via the plurality of lead frames and the plurality of inner lines.

12. The lead frame package according to claim 9, further comprising a third conductive layer, wherein the third conductive layer is formed on a side of the circuit board located away from the first conductive layer and has a plurality of outer conductive joints, and at least a part of the plurality of outer conductive joints of the third conductive layer are electrically connected to the second conductive layer only via the plurality of lead frames.

13. The lead frame package according to claim 1, wherein the plurality of lead frames are electrically connected to the plurality of conductive carriers of the first conductive layer via a plurality of soldering structures, respectively.

14. The lead frame package according to claim 1, wherein the plurality of lead frames are electrically connected to the plurality of conductive carriers of the first conductive layer via a plurality of conductive pillars and a plurality of soldering structures, respectively.

15. The lead frame package according to claim 1, wherein the plurality of lead frames comprises a plurality of first lead frames and a plurality of second lead frames, and the plurality of first lead frames and the plurality of second lead frames are located on two opposite sides of the first electronic component, respectively.

16. The lead frame package according to claim 15, wherein at least a part of the plurality of first lead frames and at least a part of the plurality of second lead frames are exposed on two opposite sides of the package body, respectively.

17. The lead frame package according to claim 16, wherein the package body has a first side surface, a second side surface, a third side surface, and a fourth side surface, the first side surface and the second side surface are located opposite to each other, the third side surface and the fourth side surface are located opposite to each other, the third side surface and the fourth side surface are located between the first side surface and the second side surface, at least a part of the plurality of conductive carriers of the first conductive layer is exposed from the first side surface of the package body, at least a part of the plurality of conductive joints of the second conductive layer is exposed from the second side surface of the package body, at least a part of the plurality of first lead frames is exposed from the third side surface of the package body, and at least a part of the plurality of second lead frames is exposed from the fourth side surface of the package body.

18. The lead frame package according to claim 15, wherein a part of the plurality of first lead frames is electrically connected to a part of the plurality of second lead frames.

19. The lead frame package according to claim 1, further comprising a second electronic component, wherein the first electronic component is located between the second electronic component and the first conductive layer, the second electronic component has a plurality of second pins, and the plurality of second pins of the second electronic component are electrically connected to ends of some of the plurality of lead frames that are located away from the first conductive layer, respectively.

20. The lead frame package according to claim 19, wherein the second electronic component is located outside the package body.

21. The lead frame package according to claim 19, wherein the second electronic component is encapsulated in the package body.

* * * * *